(12) United States Patent
Oyama et al.

(10) Patent No.: US 9,406,537 B2
(45) Date of Patent: Aug. 2, 2016

(54) COVER OPENING/CLOSING APPARATUS, THERMAL PROCESSING APPARATUS USING THE SAME, AND COVER OPENING/CLOSING METHOD

(71) Applicant: Tokyo Electron Limited, Tokyo (JP)

(72) Inventors: Katsuhiko Oyama, Iwate (JP); Yasushi Takeuchi, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 95 days.

(21) Appl. No.: 14/017,654

(22) Filed: Sep. 4, 2013

(65) Prior Publication Data

US 2014/0064885 A1    Mar. 6, 2014

(30) Foreign Application Priority Data

Sep. 6, 2012   (JP) ................................. 2012-196197

(51) Int. Cl.
*H01L 21/673*    (2006.01)
*H01L 21/677*    (2006.01)

(52) U.S. Cl.
CPC .... *H01L 21/67373* (2013.01); *H01L 21/67389* (2013.01); *H01L 21/67772* (2013.01)

(58) Field of Classification Search
CPC .................. H01L 21/67373; H01L 21/67389; H01L 21/67772
See application file for complete search history.

(56) References Cited

U.S. PATENT DOCUMENTS

| | | | | |
|---|---|---|---|---|
| 5,547,328 A * | 8/1996 | Bonora et al. | ............. | 414/217.1 |
| 5,697,750 A * | 12/1997 | Fishkin et al. | ............. | 414/217.1 |
| 5,806,574 A * | 9/1998 | Yamashita et al. | ............. | 141/63 |
| 6,419,482 B1 * | 7/2002 | Sakata et al. | ............. | 432/250 |
| 6,430,802 B1 * | 8/2002 | Miyajima | ............. | 29/464 |
| 6,533,000 B2 * | 3/2003 | Saga | ............. | 141/98 |
| 6,561,894 B1 * | 5/2003 | Miyajima | ............. | 454/187 |
| 6,984,097 B1 * | 1/2006 | Saeki et al. | ............. | 414/411 |
| 7,059,849 B2 * | 6/2006 | Sakata et al. | ............. | 432/233 |
| 7,314,068 B2 * | 1/2008 | Nakano et al. | ............. | 141/7 |
| 7,654,291 B2 * | 2/2010 | Miyajima et al. | ............. | 141/63 |
| 7,886,910 B2 * | 2/2011 | Bores et al. | ............. | 206/710 |
| 8,171,964 B2 * | 5/2012 | Okabe | ............. | 141/63 |
| 8,276,432 B2 * | 10/2012 | Godot | ............. | 73/23.2 |
| 8,485,771 B2 * | 7/2013 | Sasaki et al. | ............. | 414/411 |

(Continued)

FOREIGN PATENT DOCUMENTS

JP   2000-150613 A   5/2000
JP   2002-151584 A   5/2002

(Continued)

*Primary Examiner* — Kaitlin Joerger
(74) *Attorney, Agent, or Firm* — Abelman, Frayne & Schwab

(57) ABSTRACT

Provided is a cover opening/closing apparatus which includes: a wafer conveyance port having an opening edge and configured to be opened/closed by an opening/closing door; and a cover removal apparatus installed on the opening/closing door and configured to remove a cover of a FOUP which is formed with a substrate outlet having a opening edge. When the cover removal apparatus removes the cover of the FOUP, the opening edge of the substrate outlet is closely contacted with the opening edge of the wafer conveyance port. The cover removal apparatus includes: a latch key which is engaged with the cover of the FOUP, a driving unit configured to drive the latch key, and an accommodation unit configured to accommodate the driving unit. The cover opening/closing apparatus further includes an exhaust system configured to exhaust a space within the accommodation unit.

10 Claims, 15 Drawing Sheets

(56) References Cited

U.S. PATENT DOCUMENTS

| | | | |
|---|---|---|---|
| 8,870,516 B2* | 10/2014 | Bonora | 414/411 |
| 8,936,050 B2* | 1/2015 | Sugawara | 141/98 |
| 2002/0015636 A1 | 2/2002 | Lee et al. | |
| 2002/0179892 A1* | 12/2002 | Saeki et al. | 254/222 |
| 2006/0292037 A1* | 12/2006 | Favre et al. | 422/68.1 |
| 2009/0092468 A1* | 4/2009 | Oyama et al. | 414/222.01 |
| 2009/0142164 A1* | 6/2009 | Miyajima et al. | 414/217 |
| 2009/0196714 A1* | 8/2009 | Sylvestre et al. | 414/217.1 |
| 2012/0083918 A1* | 4/2012 | Yamazaki | 700/112 |
| 2012/0298549 A1* | 11/2012 | Fujimori et al. | 206/719 |
| 2014/0305540 A1* | 10/2014 | Oyama et al. | 141/4 |

FOREIGN PATENT DOCUMENTS

| | | |
|---|---|---|
| JP | 2005-026513 A | 1/2005 |
| JP | 2010-056296 A | 3/2010 |
| JP | 2012-195438 A | 10/2012 |

* cited by examiner

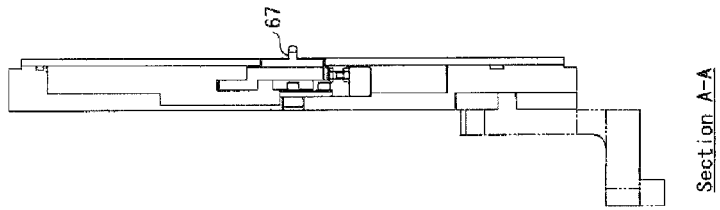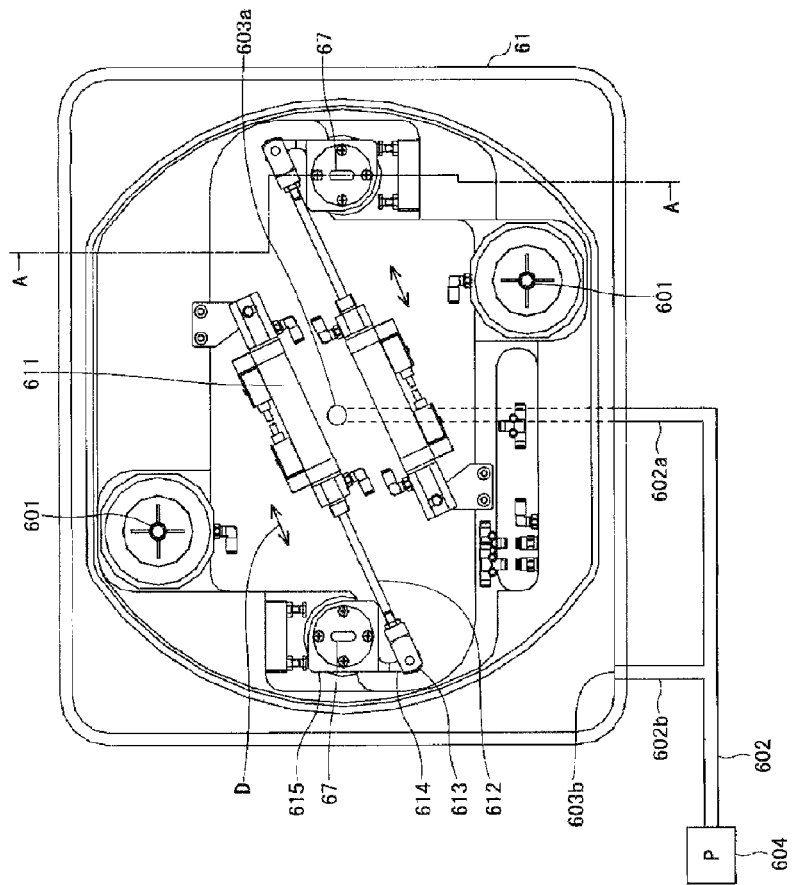

COVER OPENING/CLOSING APPARATUS, THERMAL PROCESSING APPARATUS USING THE SAME, AND COVER OPENING/CLOSING METHOD

CROSS-REFERENCE TO RELATED APPLICATIONS

This application is based on and claims priority from Japanese Patent Application No. 2012-196197, filed on Sep. 6, 2012, with the Japan Patent Office, the disclosure of which is incorporated herein in its entirety by reference.

TECHNICAL FIELD

The present disclosure relates to a cover opening/closing apparatus, a thermal processing apparatus using the same, and a cover opening/closing method.

BACKGROUND

In a conventional semiconductor manufacturing process, it is required to repeatedly conduct plural different processes such as, for example, a thermal processing, a film forming, and an etching in relation to semiconductor wafers (hereinafter, simply referred to as "wafers"). Since such various processes are often performed in different processing apparatuses, it may be required to convey wafers between the processing apparatuses. Accordingly, in order to prevent attachment of foreign matter to the surfaces of wafers or formation of a native oxide film on the surfaces of wafers when conveying the wafers, the wafers are accommodated in a substrate storage container (e.g., a wafer carrier) called FOUP (Front-Opening Unified Pod) and conveyed in a state where the cleanliness within the container is maintained at a predetermined level. The FOUP includes a container in which a plurality of wafers may be horizontally disposed and a cover installed on the front side of the container. The cover is provided with a lock apparatus and the FOUP is configured such that the wafers may be hermetically accommodated therein.

Meanwhile, each processing apparatus that conducts a processing for the wafers is formed with a wafer conveyance port through which the FOUP loaded with the wafers may be carried into the processing apparatus. The wafer conveyance port may be opened/closed by an opening/closing door according to the FIMS (Front-Opening Interface Mechanical Standard). The opening/closing door includes a cover removal apparatus configured to remove the cover installed on the front side of the FOUP, and is configured as a cover opening/closing apparatus. That is, the opening/closing door is required to perform various roles including opening/closing the cover so as to deliver wafers between the inside of the FOUP and a wafer conveyance area within the processing apparatus, and isolating the wafer conveyance area within the processing apparatus from the carrier conveyance area so as to maintain the wafer conveyance area at a low concentration of oxygen.

Specifically, when removing the cover, the cover removal apparatus acts on the lock apparatus installed on the cover so as to release locking in a state where the front side of the FOUP is closely contacted with the wafer conveyance port. Then, the cover removal apparatus is moved toward the wafer conveyance area side within the processing apparatus in a state where the cover removal apparatus retains the cover which is unlocked, thereby opening the wafers within the carrier to the wafer conveyance area. When opening the FOUP, nitrogen gas is purged between the opening/closing door and the FOUP so that the wafers carried out from the FOUP are not exposed to oxygen and the wafers are carried into the processing apparatus in a state where oxygen is prevented from being introduced into the processing apparatus.

Japanese Patent Laid-Open Publication No. 2010-56296, for example, discloses an opening/closing system includes a load port which is provided with nozzles configured to eject a gas to the surface of a cover so as to remove foreign matter.

SUMMARY

According to an aspect of the present disclosure, provided is a cover opening/closing apparatus including: a wafer conveyance port having a opening edge and configured to be opened/closed by an opening/closing door; and a cover removal apparatus installed on the opening/closing door and configured to remove a cover of a FOUP which is formed with a substrate outlet having a opening edge. When the cover removal apparatus removes the cover of the FOUP, the opening edge of the substrate outlet is closely contacted with the opening edge of the wafer conveyance port. The cover removal apparatus includes: a latch key which is engaged with the cover of the FOUP, a driving unit configured to drive the latch key, and an accommodation unit configured to accommodate the driving unit. The cover opening/closing apparatus further includes an exhaust system configured to exhaust a space within the accommodation unit.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 7A is a view illustrating the internal configuration and the exhaust system thereof as an example, and FIG. 7B is a view illustrating a cross-sectional view taken along section A-A in FIG. 7A.

DETAILED DESCRIPTION

Figure 1:
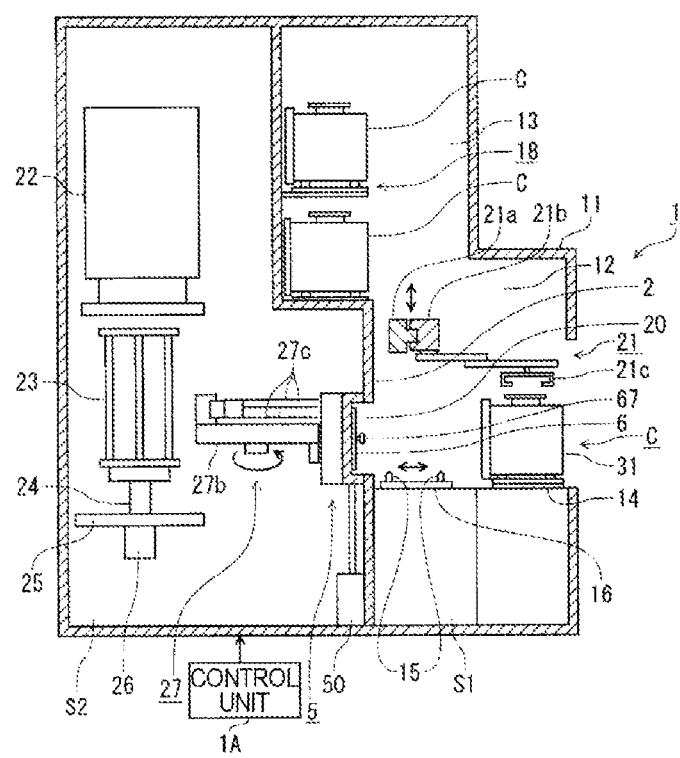
FIG. 1 is a vertical cross-sectional view illustrating a vertical thermal processing apparatus according to a first exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

The conventional cover opening/closing apparatus as described above has a problem in that, when the opening/closing door is moved, oxygen is not sufficiently exhausted although nitrogen gas is purged. As a result, nitrogen replacement may not be sufficiently performed in some cases.

In addition, when the exhaust of oxygen is not sufficient, the air which has stayed in the internal space leaks to the wafer conveyance area within the processing apparatus while the FOUP is opened. Thus, the concentration of nitrogen in the wafer conveyance area decreases and the concentration of oxygen increases. As a result, there is a problem in that a processing may not be performed for wafers in a desired manner.

In Japanese Patent Laid-Open Publication No. 2010-56296 as described above, for example, there is a problem in that the nitrogen replacement is not sufficiently performed, even if a gas is ejected in a state where the exhaust of oxygen has not been sufficiently performed.

Accordingly, an object of the present disclosure is to provide a cover opening/closing apparatus which is capable of performing nitrogen replacement quickly and sufficiently when removing the cover of the FOUP, a thermal processing apparatus employing the same, and a cover opening/closing method.

According to an aspect of the present disclosure, provided is a cover opening/closing apparatus including: a wafer conveyance port having a opening edge and configured to be opened/closed by an opening/closing door; and a cover removal apparatus installed on the opening/closing door and configured to remove a cover of a FOUP which is formed with a substrate outlet having a opening edge. When the cover removal apparatus removes the cover of the FOUP, the opening edge of the substrate outlet is closely contacted with the opening edge of the wafer conveyance port. The cover removal apparatus includes: a latch key which is engaged with the cover of the FOUP, a driving unit configured to drive the latch key, and an accommodation unit configured to accommodate the driving unit. The cover opening/closing apparatus further includes an exhaust system configured to exhaust a space within the accommodation unit.

In the above-described cover opening/closing apparatus, the exhaust system includes: an exhaust line passing through the space within the accommodation unit, and an exhaust pump connected to the exhaust line.

In the above-described cover opening/closing apparatus, the exhaust system includes a plurality of exhaust lines.

In the above-described cover opening/closing apparatus, a closed space is formed between the opening/closing door and the FOUP which is closely contact with the opening edge of the wafer conveyance port, and the cover opening/closing apparatus further comprises a closed space exhaust hole so as to exhaust the closed space.

The above-described cover opening/closing apparatus includes a purge gas ejection hole so as to supply a purge gas to the closed space.

In the above-described cover opening/closing apparatus, the latch key includes a latch key exhaust hole so as to exhaust a space around the latch key.

In the above-described cover opening/closing apparatus, the latch key exhaust hole exhausts an internal space of the cover when the latch key exhaust hole is engaged with the cover of the FOUP.

In the above-described cover opening/closing apparatus, the latch key exhaust hole is connected to a latch key exhaust line and the latch key exhaust line is commonly connected to the exhaust pump.

A thermal processing apparatus according to another aspect of the present disclosure includes: a thermal processing furnace configured to thermally process substrates; the cover opening/closing apparatus as described above; a conveyance unit having a cover which is removed by the cover opening/closing apparatus, the conveyance unit being configured to take out a substrate which is in a state of being capable of being taken out and to convey the substrate to a substrate holding unit which carries the substrate into the thermal processing furnace; and a lifting apparatus configured to carry the substrate held on the substrate holding unit into the thermal processing furnace.

A cover opening/closing method according to still another aspect of the present disclosure includes: causing an opening edge of a substrate outlet of a FOUP to be closely contacted with an opening edge of a wafer conveyance port which is opened/closed by a opening/closing door; removing a cover of the FOUP by a cover removal apparatus installed in the opening/closing door; and exhausting a space within an accommodation unit configured to accommodate a driving unit of the cover removal apparatus prior to removing the cover of the FOUP.

In the above-described cover opening/closing method, when removing the cover of the FOUP, the cover removal apparatus is moved forward, contacted with the cover to release locking, and moved backward in a state where the cover removal apparatus retains the cover, and the space within the accommodation unit is exhausted prior to releasing the locking of the cover.

In the above-described cover opening/closing method, when the cover removal apparatus is contacted with the cover, the cover removal apparatus vacuum-adsorbs the cover, and the exhaust of the space within the accommodation unit is started simultaneously with or after the vacuum adsorption.

In the above-described cover opening/closing method, a closed space is formed between the opening/closing door and the FOUP which is in close contact with the opening edge of the wafer conveyance port, and the closed space is exhausted prior to removing the cover of the FOUP.

In the above-described cover opening/closing method, a purge gas supplied to the closed space after the cover of the FOUP is removed.

In the above-described cover opening/closing method, the cover removal apparatus has a latch key which is engaged with the cover of the FOUP and, when the cover removal apparatus is engaged with the cover, an internal space of the cover is exhausted.

According to the present disclosure, the cover may be removed from the FOUP in a state where nitrogen replacement has been performed quickly and sufficiently.

Hereinafter, exemplary embodiments of the present disclosure will be described with reference to drawings.

[First Exemplary Embodiment]

Figure 2:
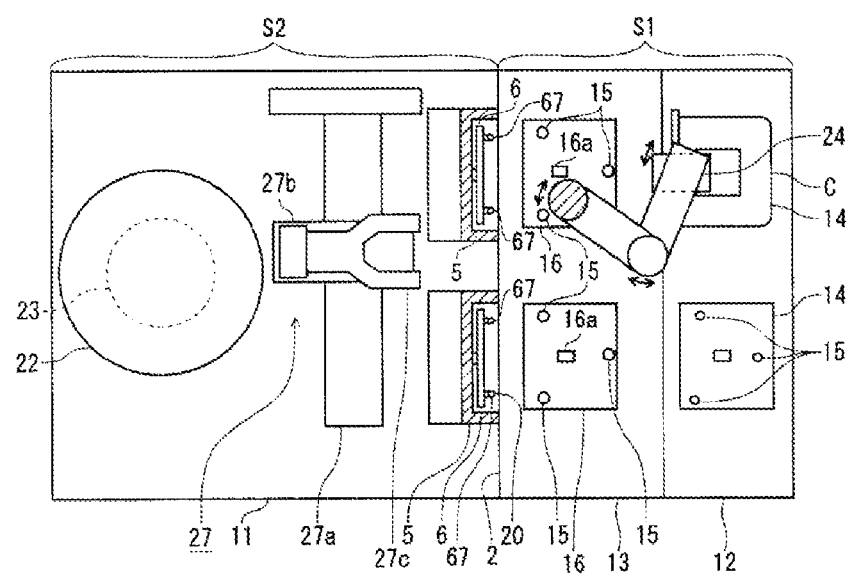
FIG. 2 is a plan view illustrating the vertical thermal processing apparatus according to the first exemplary embodiment of the present disclosure.

A vertical thermal processing apparatus into which a cover opening/closing apparatus according to a first exemplary embodiment of the present disclosure is incorporated will be described. FIG. 1 is a vertical sectional view illustrating a vertical thermal processing apparatus 1, and FIG. 2 is a plan view illustrating the vertical thermal processing apparatus 1. The cover opening/closing apparatus according to the first exemplary embodiment may be applied to a carrying-in portion of various processing apparatuses as well as the vertical thermal processing apparatus. However, for easy understanding, in the exemplary embodiments of the present disclosure, an example in which the cover opening/closing apparatus is employed in a vertical thermal processing apparatus which is one of specific processing apparatuses will be described.

As illustrated in FIGS. 1 and 2, the vertical thermal processing apparatus 1 is configured to be accommodated in a case 11. The case 11 forms an exterior body of the vertical thermal processing apparatus 1. Within the case 11, a carrier conveyance area S1 for carrying-in/carrying-out a carrier C, which is a container storing wafers W as workpieces to be processed, in relation to the thermal processing apparatus 1 and a wafer conveyance area S2, which is a shifting and loading area for carrying-in the wafers W within the carrier C into a thermal processing furnace to be described later. The carrier C is a FOUP as described above.

The carrier conveyance area S1 and the wafer conveyance area S2 are defined by a partition wall 2. The carrier conveyance area S1 is an area which is under an air atmosphere and in which the wafers W stored in the carrier C are conveyed. The carrier conveyance area S1 corresponds to an area between respective processing apparatuses. In the present exemplary embodiment, a space within a clean room in the outside of the vertical thermal processing apparatus 1 may correspond to the carrier conveyance area S1. Meanwhile, in order to suppress an oxide film from being formed on the wafer W carried into the wafer conveyance area S2, the wafer conveyance area S2 is under an inert gas atmosphere, for example, a nitrogen ($N_2$) gas atmosphere, and is maintained at a higher cleanliness and a lower oxygen concentration as compared to the carrier conveyance area S1. In the following description, it is assumed that the arrangement direction of the carrier conveyance area S1 and the wafer conveyance area S2 is a front-rear direction of the vertical thermal processing apparatus 1.

The carrier conveyance area S1 will be described. The carrier conveyance area S1 includes a first conveyance area 12, and a second conveyance area 13 positioned at the rear side of the first conveyance area 12 [at the wafer conveyance area S2 side].

As illustrated in FIG. 2, two first disposition units 14 are provided in the left-right direction in the first conveyance area 12 and a carrier C is disposed on each of the disposition units 14. On the disposition surface of each of the first disposition units 14, pins 15 are provided at, for example, three locations so as to position the carrier C.

In the second conveyance area 13, two second disposition units 16 are disposed left and right so that the second disposition units 16 are arranged with the first disposition units 14 front and rear. Each of the second disposition units 16 is configured to be movable back and forth. As in the first disposition units 14, pins 15 that align a carrier C are provided at three locations on the disposition surface of each of the second disposition units 16. Also, a hook 16a configured to fix the carrier C is provided on each disposition surface.

As illustrated in FIG. 1, a carrier storage section 18 configured to store carriers C is provided at the upper side of the second conveyance area 13. The carrier storage section 18 is configured by two or more tiers of shelves, and two carriers C may be disposed left and right on each of the shelves. FIG. 1 illustrates an example in which the shelves are two tiers.

In addition, a carrier conveyance apparatus 21 is provided in the second conveyance area 13 in which the carrier conveyance apparatus 21 is configured to convey a carrier C among the first disposition units 14, the second disposition units 16, and the carrier storage section 18. The carrier conveyance apparatus 21 includes a guide unit 21a which horizontally extends and is movable up and down, a moving unit 21b which is horizontally moved while being guided by the guide unit 21a, and a joint arm 21c provided on the moving part 21b and configured to hold and horizontally convey a carrier C.

A wafer conveyance port 20 is formed in the partition wall 2 and the carrier conveyance area S1 and the conveyance area S2 are communicated with each other through the wafer conveyance port 20. An opening/closing door 5 is provided in the wafer conveyance port 20 to block the wafer conveyance port 20 from the wafer conveyance area S2 side. The opening/closing door 5 is connected to a driving unit 50 and configured to be movable back and forth and up and down by the driving unit 50, thereby opening/closing the wafer conveyance port 20. The configurations around the opening/closing door 5 and the wafer conveyance port 20 will be described later in detail.

A vertical thermal processing furnace 22 having an opened bottom as a furnace mouth is provided in the wafer conveyance area S2. Below the thermal processing furnace 22, a wafer boat 23 that holds a plurality of wafers W in a shelf type is disposed on a cap 25 via an insulation unit 24. The cap 25 is held by a lifting apparatus 26, and the wafer boat 23 is carried into or out from the thermal processing furnace 22 by the lifting apparatus 26.

Also, a wafer conveyance apparatus 27 is provided between the wafer boat 23, and the wafer conveyance port 20 of the partition wall 2. The wafer conveyance apparatus 27 has a configuration in which 5 arms 27c that freely advance and retreat are provided in a moving body 27b. The moving body 27b is moved along a guide mechanism 27a that horizontally extends, as illustrated in FIG. 2, and revolves around a vertical axis, as illustrated in FIG. 1. The wafer conveyance apparatus 27 conveys wafers W between the wafer boat 23 and the carrier C on the second disposition unit 16.

Figure 3:
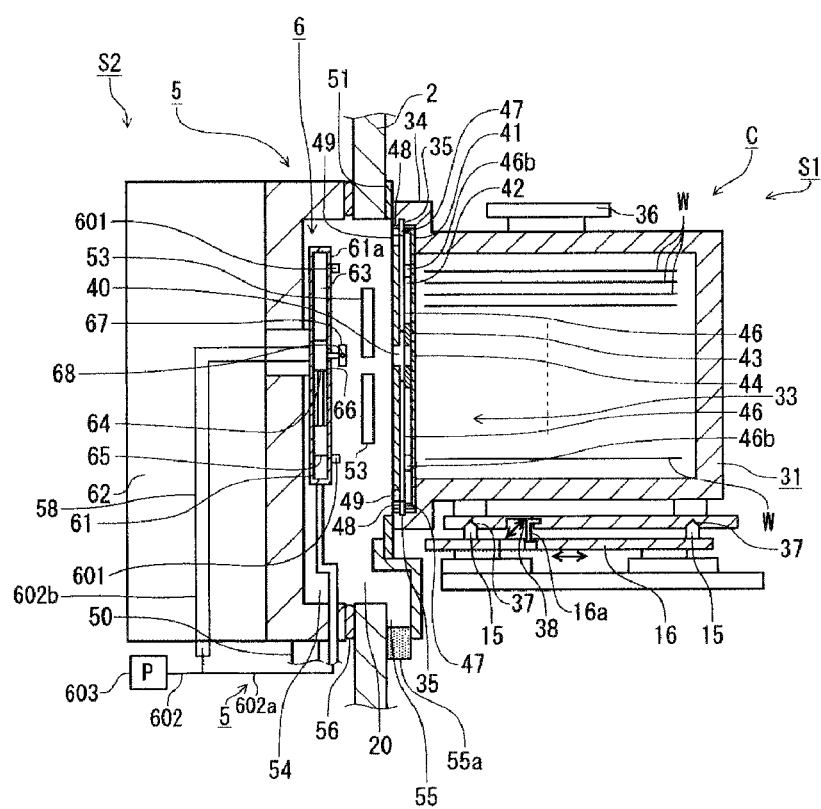
FIG. 3 is a vertical cross-sectional view illustrating a carrier, a wafer conveyance port, and an opening/closing door.
Figure 4:
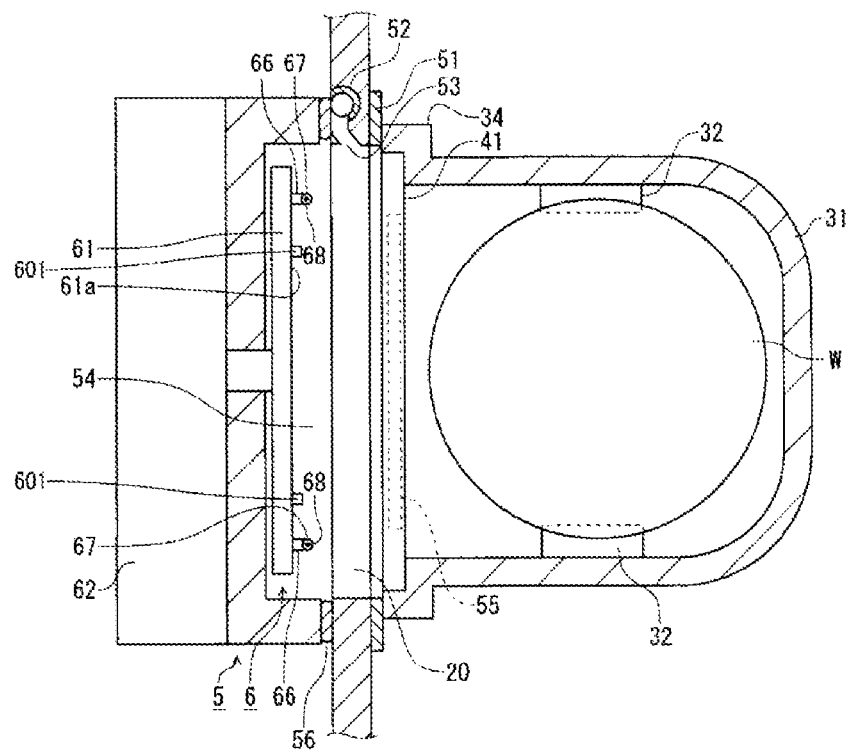
FIG. 4 is a horizontal cross-sectional view illustrating the carrier, the wafer conveyance port, and the opening/closing door.
Figure 5:
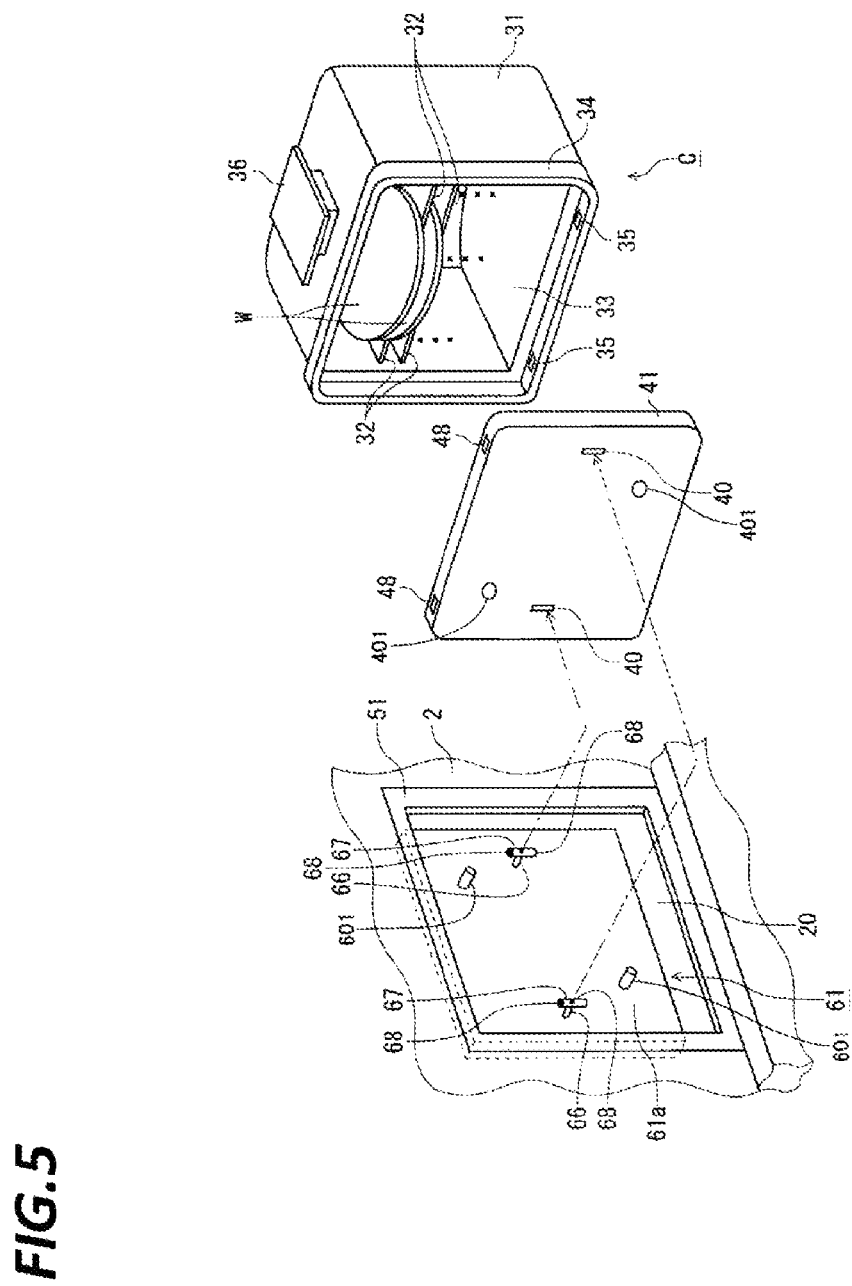
FIG. 5 is a perspective view illustrating the wafer conveyance port and the carrier.

FIGS. 3 and 4 are a vertical cross-sectional view and a horizontal cross-sectional view, respectively, illustrating a carrier C, the wafer conveyance port 20, and the opening/ closing door 5, and FIG. 5 is a perspective view illustrating the wafer conveyance port 20 and the carrier C. FIGS. 3 and 4 illustrate a state where the carrier C on the second disposition unit 16 is moved to a delivery position for delivering wafers W from/to the wafer conveyance area S2.

The carrier C will be described with reference to FIG. 5. The carrier C includes a carrier body 31 as a container body and a cover 41, and supports 32 configured to support the rear side circumferential edges of wafers W are provided in multi-tiers at the left and right of the carrier body 31. A wafer outlet 33 is formed at the front side of the carrier body 31. In the drawing, the reference symbol 34 indicates an opening edge of the wafer outlet 33, and engaging grooves 35 are formed left and right on each of the upper and lower sides of the inner periphery of the opening edge 34.

A holding unit 36 is provided at the top of the carrier body 31, which is configured to hold the carrier C when the above-described carrier conveyance apparatus 21 conveys the carrier C. Also, as illustrated in FIG. 3, recesses 37 and grooves 38 are formed on the bottom side of the carrier body 31, and the recesses 37 are fitted on the pins 15 of the first disposition unit 14 and the second disposition unit 16. The grooves 38 are engaged with the hooks 16a of the second disposition unit 16, and by this engagement, the carrier body 31 is fixed on the second disposition unit 16.

Figure 6:
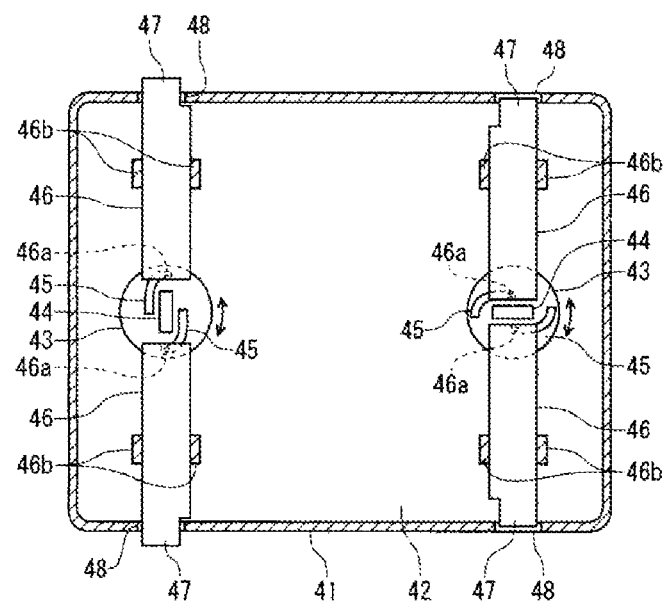
FIG. 6 is a front view illustrating a cover of the carrier partially in cross-section.

FIG. 6 is a front view illustrating a cover 41 of a carrier C partially in cross-section. As illustrated in FIG. 6, an internal space 42 is formed in the cover 41, and a disc-shaped rotating unit 43 which is rotated around the horizontal axis is provided at each of left and right sides of the internal space 42. The rotating unit 43 includes an engaging hole 44 to be engaged with a latch key 67 to be described later, and slits 45. Linear motion units 46 are provided above and below the rotating unit 43. At the base end sides of the linear motion units 46, pins 46a are provided in which the pins 46a extend in the thickness direction of the cover 41 and enter into the slits 45, respectively. When the rotating unit 43 is rotated 90 degrees, the pins 46a are moved into the slits 45 in accordance with movement of the slits 45. By this, the linear motion units 46 are moved up and down, and engaging portions 47 that form the front ends of the linear motion units 46 come in or out of the cover 41 through openings 48 formed through the lateral sides of the cover 41. In the drawing, the reference symbol 46b indicates the guides of the linear motion units 46. When the engaging portions 47 that protrude to the outside of the cover 41 are engaged with the engaging grooves 35 of the opening edge 34 of the carrier body 31, the cover 41 is fixed to the carrier body 31. Also, in FIG. 6, the engaging portions 47 at the left side are illustrated in a state where they protrude to the outside of the cover 41 so as to fix the cover 41, and the engaging portions 47 at the right side are illustrated in a state where they are drawn into the internal space 42 to release the fixation. In practice, the engaging portions 47 at the left and right sides are drawn into the internal space 42 or protrude to the outside of the cover 41 all together. For example, the carrier C may be provided with such a lock apparatus so as to lock the cover 41 in the carrier body 31.

As illustrated in FIG. 5, on the front surface of the cover 41, the insertion holes 40 of latch keys 67 are opened to overlap with the engaging holes 44 of the rotating units 43 (e.g., see FIG. 6). When the latch keys 67 are inserted into the insertion holes 40, arrive at the engaging holes 44 and rotate the rotating units 43, the locking of the carrier C may be released.

In addition, as illustrated in FIG. 5, alignment recesses 401 are formed on the front surface of the cover 41. When registration pins 601 on the support plate 61 which are opposite to the alignment recesses 401 are inserted into the alignment recesses 401, the support plate 61 and the carrier C are aligned. Such registration pins 601 may be formed in a tubular shape so that, when they are inserted into the recesses 401, they may vacuum-adsorb and retain the cover 41.

With reference to FIG. 4, the configurations of the opening/closing door 5 and the wafer conveyance port 20 will be described. In the carrier conveyance area S1 side opening edge of the wafer conveyance port 20, a seal member 51 is installed at a position where the opening edge 34 of the carrier body 31 is contacted. In addition, a $N_2$ gas supply tube 52 is installed perpendicularly at the wafer conveyance port 20 side edge. As illustrated in FIGS. 3 and 4, the $N_2$ gas supply tube 52 is provided with gas supply holes 53 at the upper and lower portions thereof in which the gas supply holes 53 extend vertically and supply $N_2$ gas to a closed space 54 enclosed by the carrier C at the wafer delivery position and the opening/closing door 5. In addition, on the bottom end portion of the wafer conveyance port 20, an exhaust hole 55 is formed which extends widthwise. In FIG. 3, reference symbol 55a indicates a porous member provided in the exhaust hole 55 so as to suppress the deflection of exhaust in the widthwise direction.

As illustrated in FIG. 3, each opening/closing door 5 is formed as a housing curved in a concave shape of which the peripheral edge faces the carrier conveyance area S1 side and a seal member 56 is mounted on the opening protrusion. Through this seal member 56, the opening/closing door 5 is closely contacted with the edge of the wafer conveyance port 20.

A cover removal apparatus 6 is provided on the carrier conveyance area S1 side of the opening/closing door 5 so as to remove the cover 41. The cover removal apparatus 6 is provided with an opposite plate 61 which is opposite to the cover 41 and accommodates a driving unit of the cover removal apparatus 6, in which the opposite plate 61 is configured to be moved back and forth by a reciprocating mechanism 62. Reference symbol 61a is an opposite surface which is opposite to the cover 41. In addition, the opposite plate 61 may be referred as an accommodation unit 61 since it accommodates the driving unit of the cover removal apparatus 6.

As described above, the driving unit of a mechanism portion configured to drive the cover removal apparatus 6 is accommodated in the inside of the opposite plate 61 and an exhaust line 602 connected to the internal space of the opposite plate 61 is provided. The exhaust line 602 is connected to a vacuum pump 604 so that the internal space of the opposite plate 61 may be exhausted. Referring to FIG. 3, the exhaust line 602 is configured such that two exhaust lines of a lower exhaust line 602a connected to the lower portion of the opposite plate 61 and a central exhaust line 602b connected to the center of the opposite plate 61 are provided and finally joined to each other as the exhaust line 602 which is connected to the vacuum pump 604. Meanwhile, when the internal space of the opposite plate 61 is capable of being exhausted, a plurality of such exhaust lines 602 may be installed at plural places communicating with the internal space of the opposite plate 61. According to use, the number of exhaust lines 602 may be variously changed.

FIGS. 7A and 7B are configuration views illustrating the inside of the opposite plate 61 and an exhaust system thereof as an example. FIG. 7A illustrates a plan view illustrating the inside and the exhaust system of the opposite plate 61 as an example, and FIG. 7B is a cross-sectional view taken along section A-A of FIG. 7A.

Referring to FIG. 7A, the opposite plate 61 includes latch keys 67, registration pins 601, exhaust lines 602a, 602b, 602, exhaust holes 603a, 603b, a vacuum pump 604, cylinders 611, pistons 612, rotation shaft members 613, connection members 614, and rotating discs 615.

Each latch key 67 is a key configured to release the locking of the cover 41 when it is engaged with an insertion hole 40 of the cover 41 of a carrier C and rotated. When a piston 612 inserted into a cylinder 611 is moved in the direction indicated by an arrow D, the corresponding rotation shaft member 613 rotates the corresponding rotating disc 615 through the corresponding connection member 614 so that the latch key 67 fixed to the rotating disc 615 may perform a rotating action. In addition, the movement of the piston 612 may be performed by supplying a fluid such as, for example, air, to the cylinder and increasing the supply amount the fluid. With this mechanism, the latch key 67 may be rotated and when the latch key rotates 90° from the vertical direction to the horizontal direction, the locking of the cover 41 of the carrier C may be released. As described above, the opposite plate 61 is equipped with the cover removal apparatus 6 and the driving unit thereof is accommodated in the internal space of the opposite plate 61. In addition, the driving unit of the latch key 67 is accommodated in the inside of the opposite plate 61 but the latch key 67 rotatably protrudes from the opposite surface 61a to be exposed. Accordingly, the opposite plate 61 does not necessarily take a completely sealed structure in the protrusion portion of the latch key 67.

The registration pins 601 are pins for positioning the carrier C by engaging with the recesses 401 of the cover 41 of the carrier C. In FIG. 7A, two registration pins 601 are proved at the left upper portion and right lower portion. The registration pins 601 may be configured in a tubular shape and connected to an exhaust system such as a vacuum pump to be capable of vacuum-adsorbing. That is, the registration pins 601 may be configured be exhausted when they are engaged with the recesses 401 of the cover 40 of the carrier C, thereby vacuum-adsorbing and retaining the cover 41. Although an exhaust system and a vacuum pump connected to the registration pins 601 are not illustrated, the exhaust system and the vacuum pump may be different from the exhaust line 602 and the vacuum pump 604, or the exhaust line 602 and the vacuum pump 604 may be configured to be used for this purpose as well. Also, the registration pins 601 also protrude from the opposite surface 61a of the opposite plate 61 to be exposed. However, since it is not necessary to move the registration pins 601, the connection portions thereof may be configured in a sealed structure.

The exhaust line 602, the exhaust holes 603a, 603b, and the vacuum pump 604 may form an exhaust system that exhausts the internal space of the opposite plate 61. In general, the volume of the opposite plate 61 is about one liter. However, when oxygen remains in the internal space, the concentration of oxygen may not be sufficiently reduced since the oxygen leaks. That is, when oxygen remains in the internal space thereof, the oxygen may leak and enter into the wafer conveyance area S2 since the opposite plate 61 is not a completely sealed structure as described above. In the past, the exhaust of the inside of such an opposite plate 61 was not performed. However, in the cover opening/closing apparatus according to the present exemplary embodiment, the internal space of the opposite space 61 is exhausted. Thus, when removing the cover 41, the concentration of oxygen may be sufficiently reduced and nitrogen replacement may be quickly and certainly performed.

In addition, an exhaust hole 603a is formed at the lower portion of the opposite plate 61 and an exhaust hole 603b is formed at the center of the opposite plate 61. The exhaust holes 603a, 603b are connected to the exhaust lines 602a, 602b which are joined together at the exhaust line 602 and connected to the vacuum pump 604. With this configuration, the internal space of the opposite plate 61 may be exhausted at the place of each of the exhaust holes 603a, 603b through the vacuum exhaust by the vacuum pump 604. However, the provided positions and number of the exhaust holes 603a, 603b and the exhaust lines 602a, 602b may be freely set according to the use thereof. In addition, although both the exhaust holes 603a, 603b and the exhaust lines 602a, 602b are exhausted by the single vacuum pump 604, the exhaust holes 603a, 603b and the exhaust lines 602a, 602b may be connected to and exhausted by separate vacuum pumps, respectively. In this manner, the arrangement and configuration of the exhaust holes 603a, 603b, the exhaust lines 602a, 602b, 602 and the vacuum pump 604 may be variously made according to the use thereof.

Further, various vacuum pumps 604 with different exhaust amounts may be used for exhaust as long as they may exhaust the internal space of the opposite plate 61. For example, a vacuum pump 604 with an air ejection amount of not less than 1 L/min may be used, and a vacuum pump 604 with an air ejection amount of, preferably, 3 L/min or more and, more preferably, 5 L/min or more may be used. As a specific example, a vacuum pump 604 with an air ejection amount of about 7 L/min may also be used. Since the air ejection amount could be large without causing any problem, so-called "maximum air ejection flow rate" does not especially exist.

FIG. 7B is a cross-sectional view taken along section A-A of the opposite plate 61 in which a protrusion portion of a latch key 67 is illustrated. Also, a configuration in which the latch key 67 is fixed to the rotating disc 615 is illustrated.

When the exhaust system 602a, 602b, 602, 603a, 603b, 604 configured to exhaust the internal space of the opposite plate 61 are provided, the leakage of oxygen from the opposite plate 61 may be substantially reduced so that the replacement of nitrogen when the cover 41 of the carrier C may be quickly and certainly performed.

In addition, as described above with reference to FIGS. 7A and 7B, various mechanical elements as driving units configured to drive the latch keys 67 are accommodated in the inside the opposite plate 61. When these elements perform mechanical actions, it is highly probable that foreign matter such as dusts may occur. According to the cover opening/closing apparatus according to the present exemplary embodiment, since the foreign matter may also be exhausted when the internal space of the opposite plate 61 is exhausted so that the inside of the opposite plate 61 may be purified, the cleanliness may be enhanced when the cover 41 is removed.

Figure 8:
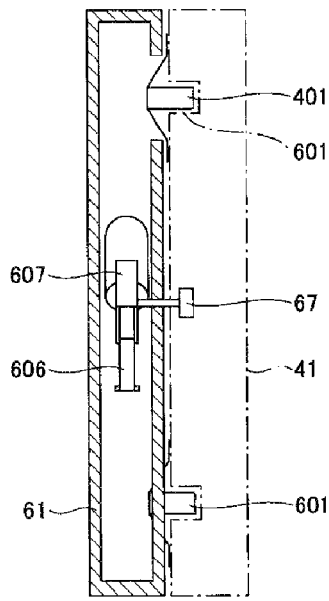
FIG. 8 is a view illustrating a relationship between the cover opening/closing apparatus according to the first exemplary embodiment and a carrier.

FIG. 8 is a vertical cross-sectional view illustrating a state in which the opposite plate 61 is closely contacted with and fixed to the cover 41 in order to remove the cover 41 as an example. As illustrated in FIG. 8, the registration pins 601 are inserted into the recesses 401 of the cover 41, the latch key 67 is engaged with the insertion hole 40 and inserted into the inside of the cover 41. At this time, when the internal space of the opposite plate 61 is sufficiently exhausted, the amount of oxygen leaking to the outside from the opposite plate 61 becomes very little so that the cover 41 may be opened as a low oxygen state.

Figure 9:
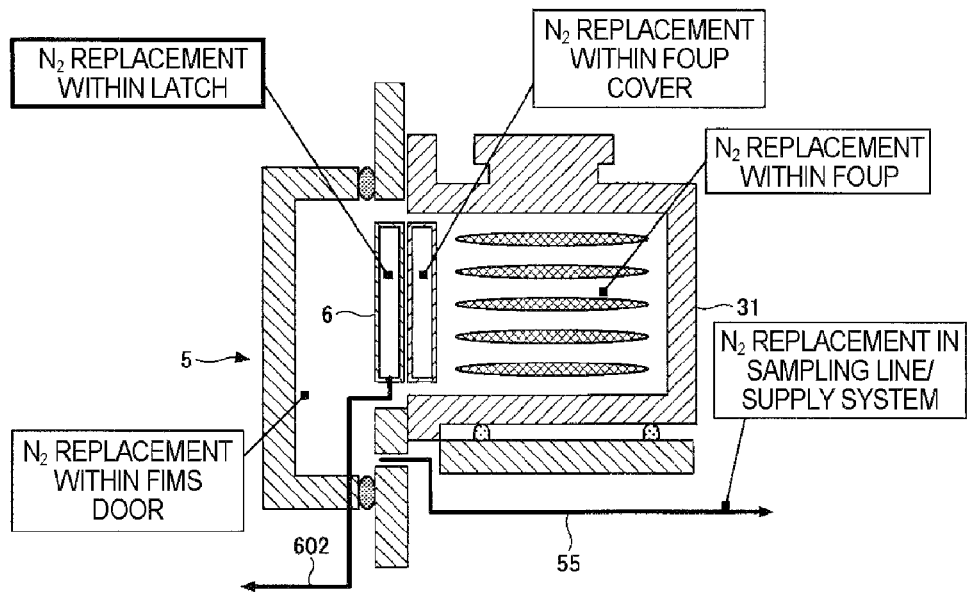
FIG. 9 is a view illustrating a relationship between the cover opening/closing apparatus according to the first exemplary embodiment and a carrier.

FIG. 9 is a view illustrating a relationship between the cover opening/closing apparatus according to the first exemplary embodiment and a carrier C (FOUP). As illustrated in FIG. 9, the portions where $N_2$ replacement should be performed when the cover 41 of the FOUP is removed include four spaces of the internal space of the carrier body 31 (the interior of the FOUP), the internal space of the cover 41, the internal space of the opposite plate 61 which accommodates the cover removal apparatus 6 of the cover 41, and the internal space between the opening/closing door 5 and the FOUP. For example, the volumes of the four spaces are believed to be as follows: the internal space of the carrier body 31 is about 40 liters, the internal space of the cover 41 is about 1 liter, the internal space of the opposite plate 61 is about 1 liter, and the internal space between the opening/closing door 5 and the FOUP is about 4 to 5 liters.

Here, $N_2$ replacement has been conventionally performed for the internal space within the carrier body 31 of the largest volume (about 40 liters) from the past, and for the internal space between the opening/closing door 5 and the FOUP which has the next larger volume (about 4 to 5 liters), oxygen exhaust has also been performed through the exhaust holes 55 as described with reference to FIG. 3.

However, for the internal space of the opposite plate 61 of the cover removal apparatus 6 and the internal space of the cover 41 which do not cause serious problem due to the small volume (about 1 liter), exhaust has not been performed in the past. In the present exemplary embodiment, oxygen is efficiently exhausted and when $N_2$ is supplied next, N2 replacement may be quickly performed by providing the exhaust line 602 to exhaust the internal space of the opposite plate 61.

Since the internal space of the cover 41 is also exhausted, the oxygen reduction effect can be enhanced. This will be described in the second exemplary embodiment.

Figure 10:
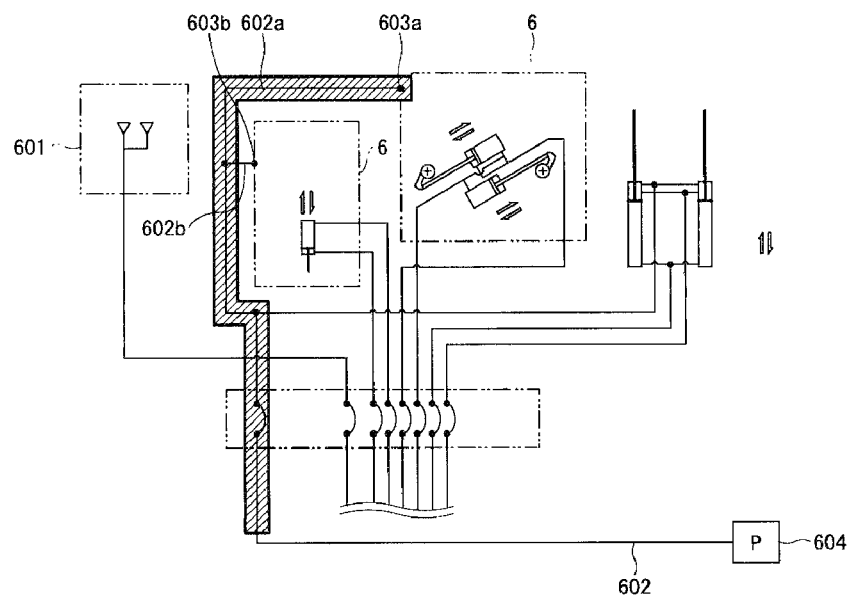
FIG. 10 is a view illustrating a fluid circuit of the cover opening/closing apparatus according to the first exemplary embodiment as an example.

FIG. 10 is a view illustrating a fluid circuit of the cover opening/closing apparatus according to the first exemplary embodiment as an example. Referring to FIG. 10, an exhaust system connected to the vacuum pump 604 via the exhaust line 602 from the exhaust hole 603a and the exhaust line 602a and an exhaust system joined to the exhaust line 602 from the exhaust hole 603b and the exhaust line 602b and connected to the vacuum pump 604 are illustrated in the internal space of the opposite plate 61 of the cover removal apparatus 6. As illustrated in FIG. 10, since the internal space of the opposite plate 61 is a relatively small volume, it may be commonly vacuum-exhausted with the single vacuum pump 604. In addition, in FIG. 10, the driving units of the latch keys 67 and the driving unit which moves the cover removal apparatus 6 back and forth are schematically illustrated since the exhaust holes 603a, 603b may also be used as an exhaust system that sucks the driving air. That is, although the driving units including cylinders 611 and pistons 612 is illustrated in FIG. 7A, a configuration may be employed in which exhaust holes 603a, 603b are arranged in the vicinity of the driving units operated by air so that used air does not leak and the internal space of the opposite plate 61 may also be exhausted through the exhaust holes 603a, 603b.

In addition, in FIG. 10, an exhaust system for use in vacuum-adsorption of the registration pins 601 provided on the opposite surface 61a of the opposite plate 61 and an air piping of a driving system that performs opening/closing of the opening/closing door 5 by vertical movement are illustrated. Like this, the exhaust system including the exhaust holes 603a, 603b, the exhaust lines 602a, 602b, 602, and the vacuum pump 604 may be configured in consideration of the balance with, for example, the air piping for driving and the exhaust piping for vacuum adsorption.

Also, as illustrated in FIG. 1, the vertical thermal processing apparatus 1 is provided with a control unit 1A configured by, for example, a computer. The control unit 1A includes, for example, a data processing unit which is made up of a program, a memory and a CPU, and in the program, commands (individual steps) are set such that control signals are sent from the control unit 1A to each unit of the vertical thermal processing apparatus 1 to carry each of the above-described processing processes. By the control signals, the operations such as, for example, conveyance of carriers C, conveyance of wafers W, opening/closing of the cover 41, opening/closing of the opening/closing door 5, and supply of $N_2$ gas to the cover 41, are controlled and thus, the conveyance and processing of wafers W are performed, as will described below. The program may be stored in a computer readable recording medium such as, for example, a flexible disc, a compact disc, a hard disc, a magneto-optical (MO) disc, and a memory card, and installed in the control unit 1A.

Next, with reference to FIGS. 1, 2 and 11 to 15, the operations of the cover operating and closing apparatus according to the present exemplary embodiment will be described as an example. In addition, the configuration elements described up to now will be assigned with the same reference symbols and the descriptions thereof will be omitted.

Referring to FIGS. 1 and 2, first, a carrier C is disposed on a first disposition unit 14 by an automatic conveyance robot (not illustrated) which moves along a ceiling portion of a clean room. Next, the carrier C is conveyed to a second disposition unit 16 by the carrier conveyance apparatus 21 and fixed to the second disposition unit 16 by the hook 16a. The second disposition unit 16 is moved toward the partition wall 2.

Figure 11:
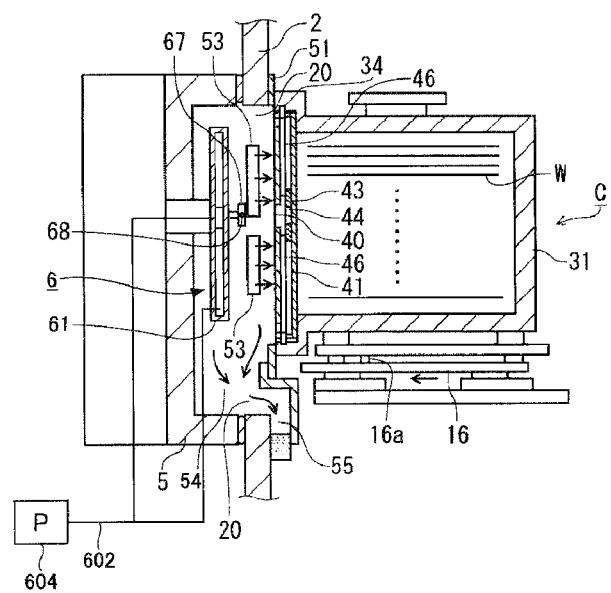
FIG. 11 is a view illustrating a state where the carrier is in close contact with the wafer conveyance port.

FIG. 11 is a view illustrating a state where the carrier C is closely contacted with the wafer conveyance port 20. As illustrated in FIG. 11, when the second disposition unit 16 is moved toward the partition wall 2, the opening edge 34 of the carrier C is hermetically contacted with the seal member 51 on the opening edge around the wafer conveyance port 20 of the partition wall 2.

Then, $N_2$ gas is supplied from the gas supply holes 53 to the closed space 54 between the carrier C and the opening/closing door 5 and flows to the exhaust hole 55 so that the closed space 54 is replaced from the air atmosphere to the nitrogen atmosphere. Then, the opposite plate 61 is forwardly moved toward the cover 41. In addition, the supply of $N_2$ gas and the exhaust from the exhaust hole 55 are continued in the subsequent operations.

Figure 12:
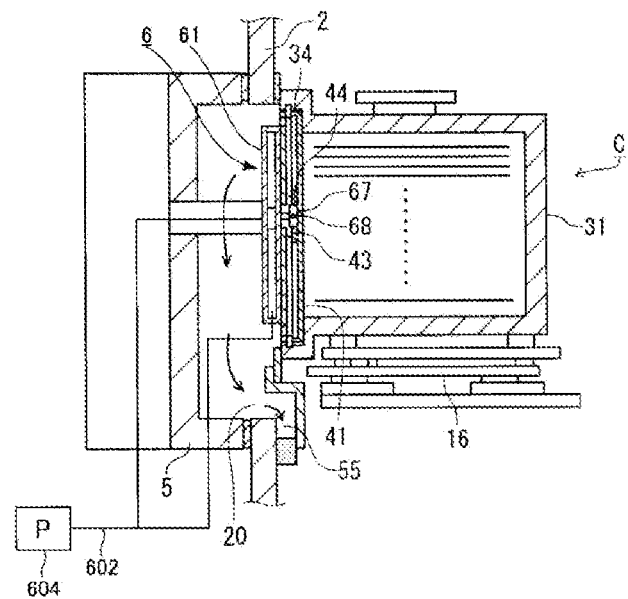
FIG. 12 is a view illustrating a state where the opposite plate of the cover removal apparatus is in contact with the cover.

FIG. 12 is a view illustrating a state where the opposite plate 61 of the cover removal apparatus 6 is contacted with the cover 41. When the opposite plate 61 is forwardly moved and contacted with the cover 41, the latch key 67 is introduced into the internal space 42 of the cover 41 through the insertion hole 40 in the front surface of the cover 41 and inserted into the engaging hole 44 of the rotating unit 43 to be engaged with the rotating unit 43.

Figure 13:
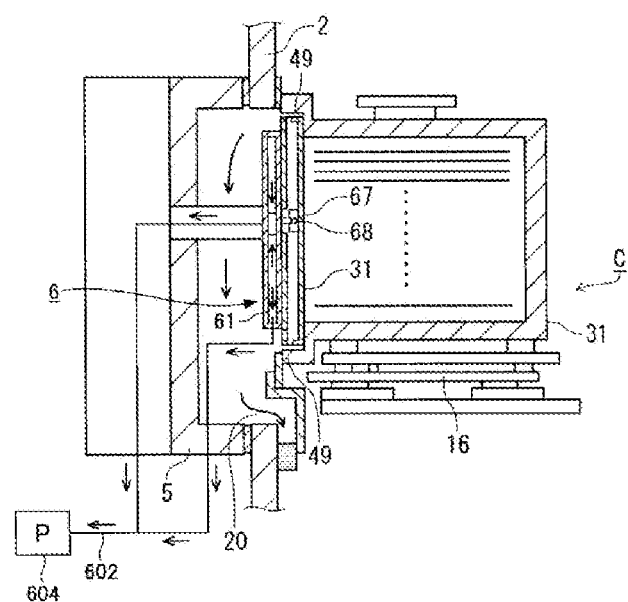
FIG. 13 is a view illustrating a state where the cover is vacuum-adsorbed by the opposite and thus, fixed to the opposite plate.

FIG. 13 is a view illustrating a state where the opposite plate 61 vacuum-adsorbs the cover 41 so that the cover 41 is fixed to the opposite plate 61. In this state, the vacuum pump 604 is activated to start the exhaust of the internal space of the opposite plate 61. By this, the concentration of oxygen within the opposite plate 61 is reduced.

Next, while maintaining the exhaust, the latch key 67 pivots 90 degrees, thereby rotating the rotating unit 43 of the cover 41. As a result, the engaging portion 47 on the front end of the linear motion unit 46 is introduced into the cover 41 and the engagement between the engaging portion 47 and the engaging groove 35 of the carrier body 31 is released. By this, the engagement of the cover 41 in relation to the carrier body 31 is released such that the latch key 67 is retained in the cover 41.

Figure 14:
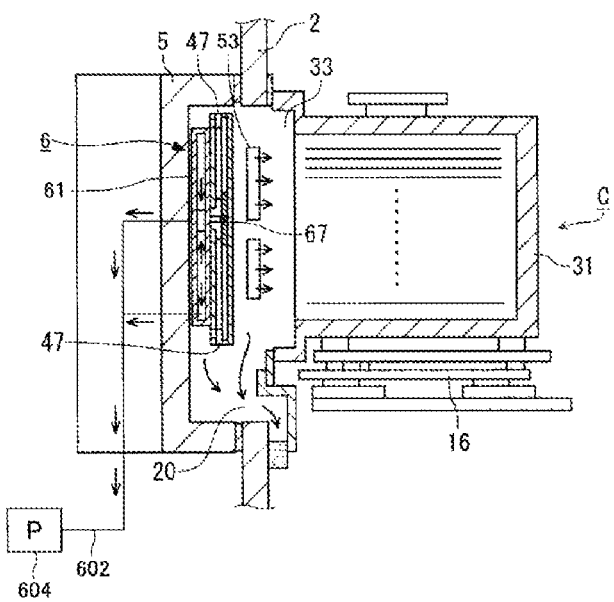
FIG. 14 is a view illustrating a state where the cover is removed.

FIG. 14 is a view illustrating a state where the cover 41 is removed. After the locking of the cover 41 and the carrier body 31 is released, the cover removal apparatus 6 is moved back toward the opening/closing opening 5 in the state where the cover 41 is maintained by the latch key 67, thereby opening the wafer outlet 33 of the carrier body 31. During this, the exhaust from the inside of the opposite plate 61 is continued.

Here, since N₂ gas is continuously supplied from the gas supply holes 53 to form a low-oxygen atmosphere, N₂ replacement is achieved within a short time.

Figure 15:
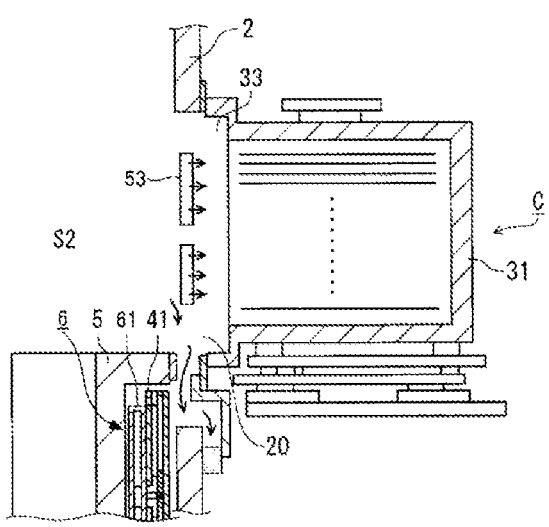
FIG. 15 is a view illustrating a state where the opening/closing door is lowered and wafers are opened.

FIG. 15 is a view illustrating a state where the opening/closing door 5 is lowered and wafers W are opened. When the cover removal apparatus 6 is moved back and arrives at the inner wall of the opening/closing door 5, the opening/closing door 5 is also moved back in unison with the opening/closing door 5. Thereafter, the opening/closing door 5 is lowered and moved back from the wafer conveyance port 20 and, as illustrated in FIG. 15, the interior space of the carrier C is opened to the wafer conveyance area S2.

Then, as illustrated in FIG. 1, the wafers W within the carrier C are sequentially taken out by the wafer conveyance apparatus 27 and shifted and loaded in the wafer boat 23. When the wafers W within the carrier C are removed, the cover 41 is closed and fixed to the carrier body 31 through the operations in reverse to those described above. Thereafter, the disposition unit 16 is moved back to move the carrier C away from the partition wall 2 and the carrier C is conveyed by the carrier conveyance apparatus 21 to the carrier storage section 18 and temporarily stored therein.

Meanwhile, the wafer boat 23 loaded with the wafers W is carried into the thermal processing furnace 22 and thermal processings, such as, for example, CVD, annealing, and oxidation, are performed. Thereafter, when the processed wafers W are returned, the cover 41 is opened in the same sequence as the sequence when the wafers W are taken out from the carrier C.

As described above, the cover opening/closing apparatus, the cover opening/closing method, and the thermal processing apparatus according to the present exemplary embodiment, N2 replacement may be ensured to be performed quickly by exhausting the internal space of the opposite plate 61 in which the driving units of the cover removal apparatus 6 are accommodated, thereby reducing the concentration of oxygen.

Figure 16:
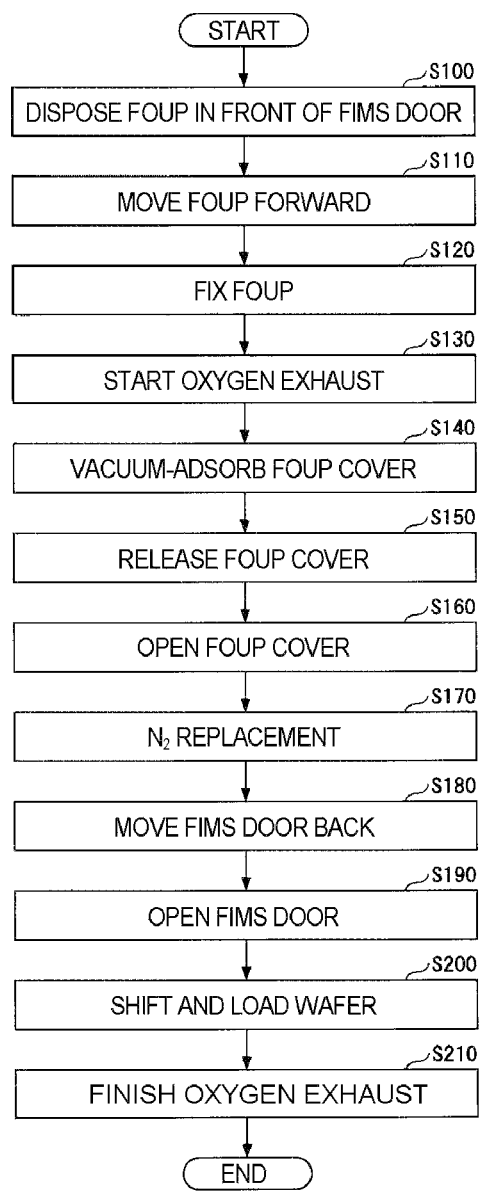
FIG. 16 is a processing flowchart of the cover opening/closing apparatus and the cover opening/closing method according to the first exemplary embodiment

Next, with reference to FIG. 16, a processing flow of the cover opening/closing apparatus and the cover opening/closing method according to the present embodiment will be described. FIG. 16 is a processing flowchart of the cover opening/closing apparatus and the cover opening/closing method according to the present embodiment. The configuration elements described up to now will also be assigned with the same reference symbols and the descriptions thereof will be omitted.

Referring to FIG. 16, in step S100, a FOUP (carrier C) is disposed at a predetermined position in front of FIMS door, i.e. the wafer conveyance port 20.

At step S110, the FOUP is moved forward toward the wafer conveyance port 20.

At step S120, the opening edge of the FOUP is closely contacted with and fixed to the opening edge of the wafer conveyance port 20 through the seal member 51. In addition, in this step, the supply of nitrogen gas from the gas supply holes 53 is preferably started.

At step S130, the internal space of the opposite plate 61 of the cover removal apparatus 6 is exhausted and the oxygen within the internal space is exhausted. By this, leakage of oxygen from the opposite plate 61 may be prevented.

At step S140, the opposite plate 61 is moved forward and contacted with the cover 41 of the FOUP, and the cover 41 is fixed to the opposite plate 61 by vacuum adsorption. At the same time, the latch key 67 is inserted into the insertion hole 40 of the cover 41 and arrives at the engaging hole 44, thereby being engaged with the engaging hole 44.

At step S150, the latch key 67 is rotated, thereby releasing the locking of the cover 41 of the FOUP.

At step S160, the opposite plate 61 is moved back in the state where it retains the cover 41 so that the cover 41 of the FOUP is removed.

At step S170, N2 replacement is performed by the N2 gas supplied from the gas supply holes 53 and the inside of the closed space 54 is filled with nitrogen gas.

At step S180, when the opposite plate 61 arrives at the inner wall of the opening/closing door 5, the opening/closing door 5 is moved back.

At step S190, the opening/closing door 5 is lowered, and the wafers W are opened to the wafer conveyance area S2 of the vertical thermal processing apparatus 1.

At step S200, shifting and loading of the wafers W are performed so that wafers are shifted and loaded on a predetermined carrying-in position to the thermal processing furnace 22, i.e., the wafer boat 23.

At step S210, the exhaust of oxygen is ended and the processing process is ended. However, the exhaust of oxygen may be continuously performed or step S210 may not be necessarily performed.

When this processing flow is executed, the concentration of oxygen in the closed space 54 is reduced, and thus, the nitrogen replacement may be quickly performed.

In addition, in the present processing process, the exhaust of the internal space of the opposite plate 61 of the cover removal apparatus 6 is started at the step where the FOUP is fixed to the wafer conveyance port. However, the exhaust of oxygen may be started at step S130 and continued to step S150 or step S160. Alternatively, the exhaust of oxygen may be performed at step 150 or step 160.

When the start timing of exhaust of oxygen is prior to opening the cover 41 of the FOUP, the start timing may be set to various timings according to the use of the FOUP.

EXAMPLE

Figure 17:
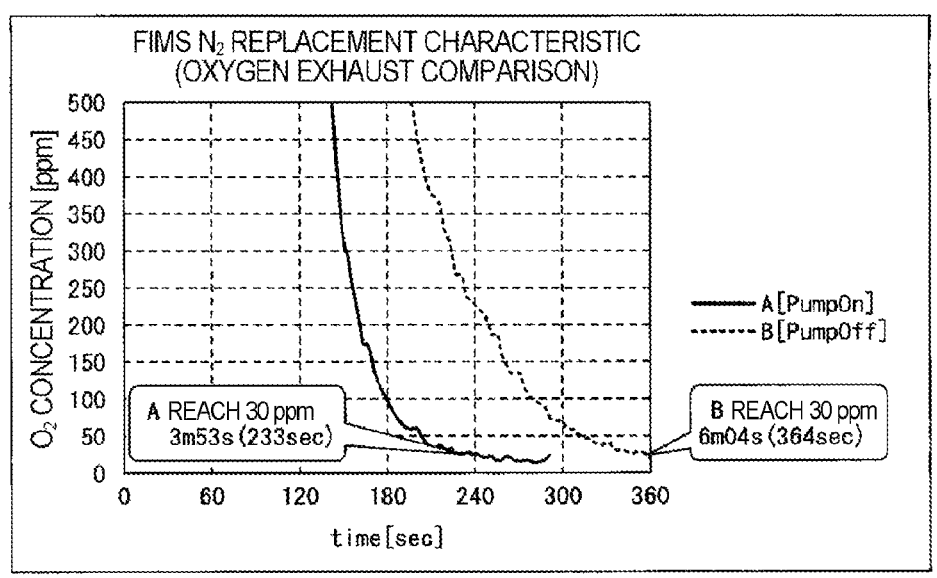
FIG. 17 is a graph illustrating results of executing the cover opening/closing apparatus and the cover opening/closing method according to the first exemplary embodiment as an example.

FIG. 17 is a graph illustrating an example of executing result of the cover opening/closing apparatus and the cover opening/closing method according to the first exemplary embodiment. In FIG. 17, "A" indicates the characteristic of executing result of the cover opening/closing apparatus and the method cover opening/closing method and "B" indicates an executing result of a cover opening/closing apparatus and a cover opening/closing method according to a conventional example. The horizontal axis indicates time [sec] used and the vertical axis indicates oxygen concentration [ppm].

As illustrated in FIG. 17, the concentration of oxygen is reduced together with the elapse of time and nitrogen replacement progresses. However, upon comparing the lengths of time when the concentration of nitrogen arrives at 30 ppm, the present exemplary embodiment corresponds to 233 sec and the conventional example corresponds to 364 sec.

That is, it can be seen that the cover opening/closing apparatus and the cover opening/closing method according to the present exemplary embodiment which exhaust the accommodation unit of the driving units of the cover removal apparatus may arrive at the target concentration of oxygen within a shorter length of time than the cover opening/closing apparatus and the cover opening/closing method of the conventional example which does not perform the exhaust.

Thus, with the cover opening/closing apparatus and the cover opening/closing method according to the present exemplary embodiment, the nitrogen replacement may be ensured to be performed quickly by exhausting the accommodation unit of the driving units of the cover removal apparatus to reduce the concentration of oxygen concentration.

[Second Exemplary Embodiment]

Figure 18:
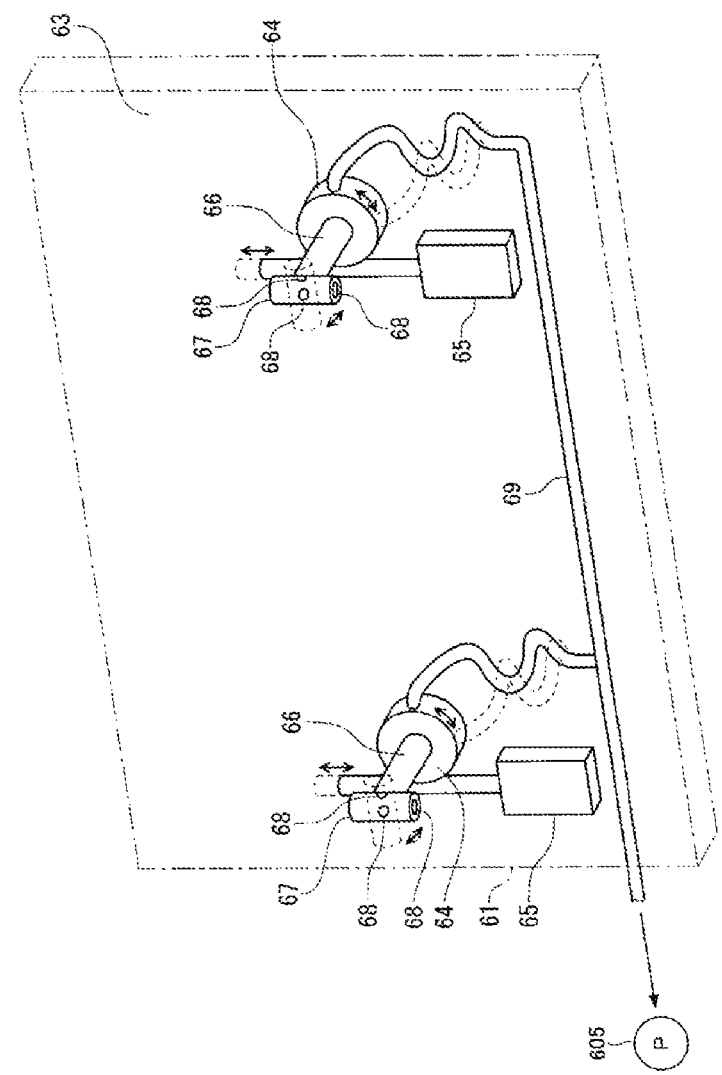
FIG. 18 is a perspective view illustrating an opposite plate of a cover opening/closing apparatus according to a second exemplary embodiment as an example.

FIG. 18 is a perspective view illustrating an example of a cover opening/closing apparatus, a cover opening/closing method, and an opposite plate of the cover opening/closing apparatus according to the second exemplary embodiment of the present disclosure. In the second exemplary embodiment, each latch key 67 is also provided with an exhaust mechanism and when the latch key 67 is inserted into the cover 41 of a carrier C, the internal space of the cover 41 is exhausted by the latch key 67.

Thus, FIG. 18 illustrates only the portions of the opposite plate 61 which is a modified unit to the first exemplary embodiment. For the other configuration elements, the configuration elements of the first exemplary may be applied as they are.

Referring to FIG. 18, an internal space 63 is formed in the inside of the opposite plate 61, and circular rotating units 64, each of which rotates about a horizontal shaft and air cylinders 65 connected to the rotating units 64 and configured to rotate the rotating units 64 are provided within the internal space 63. A rod-shaped connection unit 66 extends through the opposite surface 61a in the widthwise direction from the center of rotation of each rotating unit 64 and a latch key 65 which is, for example, a cylindrical rod, is provided on the connection unit 66. Each latch key 67 is formed to be engaged with an engaging hole 44 of a rotating unit 43 of a cover 41 of a carrier C. The shape of the latch key 67 is not limited to the cylindrical shape as illustrated and may be a prismatic shape as long as the shape allows the latch key 67 to be engaged with the engaging hole 44. An angled portion of the cylindrical shape or the prismatic shape may be rounded.

The latch key 67 is configured as a purge gas ejection unit which is provided with exhaust holes 68 at the opposite ends in the longitudinal direction of the latch key, in the extension direction of the connection unit 66, and in the left and right directions when viewed in the extension direction. The diameter of each exhaust hole 68 is, for example, about 1 mm to 2 mm. The upstream side of each exhaust hole 68 is connected to exhaust paths (not illustrated) which are formed in the connection unit 66 and the rotating unit 64, respectively, and communicated with a piping 69. The upstream side of the piping 69 is connected to the vacuum pump 605. The piping 69 is made up of a so-called flexible piping and configured to be bent following the rotation of the rotating unit 64 so as not to impede the rotation of the rotating unit 64.

As described above, the second exemplary embodiment is configured such that each latch key 67 is formed with exhaust holes 68 which are in turn connected to the vacuum pump 605 via exhaust paths and the piping 69 so that exhaust from the latch key 67 is also enabled. With this configuration, when the latch key 67 are engaged the insertion hole 40 and engaging hole 44 of the cover 41 of a carrier C, the internal space of the cover 41 may be exhausted by performing exhaust through the exhaust holes 68.

Figure 19:
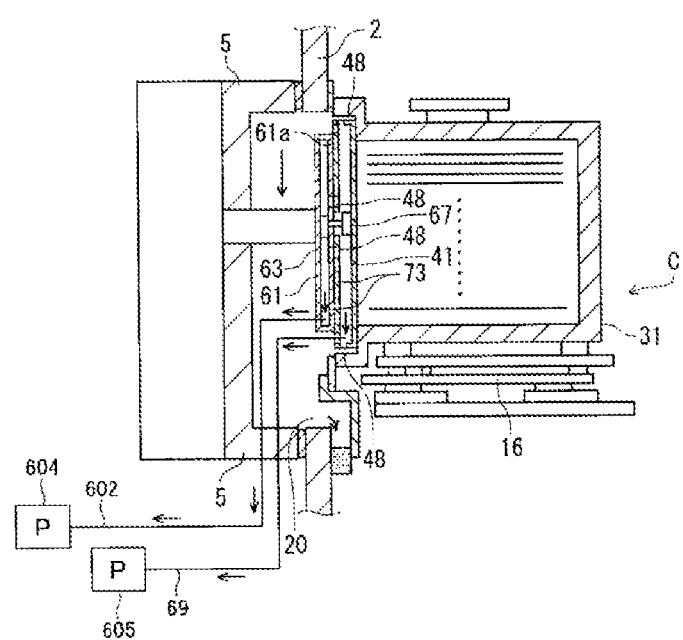
FIG. 19 is cross-sectional view illustrating the configuration of the cover opening/closing apparatus according to the second exemplary embodiment as an example.

FIG. 19 is a cross-sectional view illustrating an example of a configuration of a cover opening/closing apparatus according to the second exemplary embodiment. As illustrated in FIG. 19, the latch key 67 is inserted into the internal space of the cover 41. In this state, when the vacuum pump 605 as an exhaust pump is activated, the internal space of the cover 41 may be exhausted through the piping 69. In addition, as in the first exemplary embodiment, the internal space of the opposite plate 61 may be exhausted by the vacuum pump 605 through the exhaust line 602 so as to reduce the concentration of oxygen.

As described above, according to the cover opening/closing apparatus and the cover opening/closing method according to the second exemplary embodiment, since the internal space of the cover 41 as well as the internal space of the opposite plate 61 are configured such that oxygen can be exhausted, the concentration of oxygen may be further reduced and as a result, N2 replacement may be ensured to be performed even more quickly.

Although the second exemplary embodiment includes a driving unit for the cover removal apparatus which is different from that in the first exemplary embodiment, the second exemplary embodiment may include the same configuration of the driving unit as the first exemplary embodiment and is not limited to a specific configuration of the driving unit.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A cover opening/closing apparatus comprising:
a wafer conveyance port having an opening edge and configured to be opened/closed by an opening/closing door;
a cover removal apparatus installed on the opening/closing door to be accommodated within an accommodation unit and configured to remove a cover of a FOUP which is formed with a substrate outlet having an opening edge; and
a closed space exhaust hole formed on a bottom end portion of the wafer conveyance port and configured to exhaust a closed space formed between the opening/closing door of the wafer conveyance port and the FOUP when the opening edge of the FOUP is closely contacted with the opening edge of the wafer conveyance port,
wherein, when the cover removal apparatus removes the cover of the FOUP, the opening edge of the substrate outlet is closely contacted with the opening edge of the wafer conveyance port, and the cover removal apparatus includes:
a latch key configured to protrude from the accommodation unit to be engaged with the cover of the FOUP in order to open the cover of the FOUP when rotated and including a latch key exhaust hole connected to exhaust paths in the latch key so as to exhaust a space around the latch key as well as an internal space of the cover of the FOUP when the latch key exhaust hole is engaged with the cover of the FOUP;
a driving unit configured to drive the latch key; and
an exhaust system configured to exhaust an internal space within the accommodation unit.

2. The cover opening/closing apparatus of claim 1, wherein the exhaust system includes:
an exhaust line passing through the internal space within the accommodation unit, and
an exhaust pump connected to the exhaust line.

3. The cover opening/closing apparatus of claim 2, wherein the exhaust system includes a plurality of exhaust lines.

4. The cover opening/closing apparatus of claim 1, further comprising a purge gas ejection hole so as to supply a purge gas to the closed space.

5. The cover opening/closing apparatus of claim 2, wherein the latch key exhaust hole is connected to a latch key exhaust line and the latch key exhaust line is commonly connected to the exhaust pump.

6. A thermal processing apparatus comprising:
a thermal processing furnace configured to thermally process substrates;
the cover opening/closing apparatus as claimed in claim 1;
a conveyance unit having a cover which is removed by the cover opening/closing apparatus, the conveyance unit being configured to take out a substrate capable of being taken out and to convey the substrate to a substrate holding unit which carries the substrate into the thermal processing furnace; and
a lifting apparatus configured to carry the substrate held on the substrate holding unit into the thermal processing furnace.

7. A cover opening/closing method comprising:
causing an opening edge of a substrate outlet of a FOUP to be closely contacted with an opening edge of a wafer conveyance port which is opened/closed by an opening/closing door;
providing a cover removal apparatus including a latch key which is configured to engage with a cover of the FOUP and includes a latch key exhaust hole connected to exhaust paths in the latch key so as to exhaust a space around the latch key, the cover removal apparatus being installed in the opening/closing door to be accommodated within an accommodation unit;
exhausting a closed space formed between the opening/closing door of the wafer conveyance port and the FOUP through a closed space exhaust hole formed on a bottom end portion of the wafer conveyance port when the opening edge of the FOUP is closely contacted with the opening edge of the wafer conveyance part;
removing the cover of the FOUP by the cover removal apparatus installed in the opening/closing door;
exhausting an internal space within the accommodation unit prior to removing the cover of the FOUP; and
exhausting an internal space of the cover of the FOUP through the latch key exhaust hole when the latch key of the cover removal apparatus is engaged with the cover of the FOUP so as to remove the cover of the FOUP.

8. The cover opening/closing method of claim 7, wherein the removing the cover of the FOUP includes:
causing the cover removal apparatus to move forward and contact with the cover to release locking, and
causing the cover removal apparatus retain the cover and move backward, thereby removing the cover of the FOUP, and
initiating the exhausting of the internal space within the accommodation unit prior to releasing of the locking of the cover.

9. The cover opening/closing method of claim 8, wherein the causing the cover removal apparatus to contact with the cover includes:
allowing the cover removal apparatus to vacuum-adsorb the cover, and
initiating the exhausting of the internal space within the accommodation unit simultaneously with or after the vacuum adsorption.

10. The cover opening/closing method of claim 7, further comprising:
supplying a purge gas to the closed space after removing the cover of the FOUP.

* * * * *